US009053925B2

(12) United States Patent
Bailey, III et al.

(10) Patent No.: US 9,053,925 B2
(45) Date of Patent: *Jun. 9, 2015

(54) CONFIGURABLE BEVEL ETCHER

(75) Inventors: Andrew D. Bailey, III, Pleasanton, CA (US); Alan M. Schoepp, Ben Lomond, CA (US); Gregory Sexton, Fremont, CA (US); Yunsang Kim, Monte Sereno, CA (US); William S. Kennedy, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/081,264

(22) Filed: Apr. 6, 2011

(65) Prior Publication Data
US 2011/0214687 A1    Sep. 8, 2011

Related U.S. Application Data

(63) Continuation of application No. 11/698,190, filed on Jan. 26, 2007, now Pat. No. 7,943,007.

(51) Int. Cl.
*H01L 21/00*    (2006.01)
*H01L 21/02*    (2006.01)
(Continued)

(52) U.S. Cl.
CPC ....... *H01L 21/0209* (2013.01); *H01J 37/32366* (2013.01); *H01J 37/32568* (2013.01); *H01J 2237/335* (2013.01); *H01L 21/67069* (2013.01)

(58) Field of Classification Search
CPC .............. H01J 2237/335; H01J 37/32642; H01J 37/32366; H01J 37/32568; H01L 21/0209; H01L 21/02087

USPC ............ 156/345.43, 345.44, 345.45, 345.46, 156/345.47; 438/710; 216/67; 134/1.2
See application file for complete search history.

(56) References Cited

U.S. PATENT DOCUMENTS

| 4,875,989 | A | 10/1989 | Davis et al. |
| 4,899,195 | A | 2/1990 | Gotoh |

(Continued)

FOREIGN PATENT DOCUMENTS

| JP | 02-192717 | 7/1990 |
| JP | 05-082478 | 4/1993 |

(Continued)

OTHER PUBLICATIONS

Official Action mailed Apr. 13, 2012 for Japanese Appln. No. 2009-547292.

(Continued)

*Primary Examiner* — Sylvia R MacArthur
*Assistant Examiner* — Anna Crowell
(74) *Attorney, Agent, or Firm* — Buchanan Ingersoll & Rooney PC

(57) ABSTRACT

A device for cleaning a bevel edge of a semiconductor substrate. The device includes: a lower support having a cylindrical top portion; a lower plasma-exclusion-zone (PEZ) ring surrounding the outer edge of the top portion and adapted to support the substrate; an upper dielectric component opposing the lower support and having a cylindrical bottom portion; an upper PEZ ring surrounding the outer edge of the bottom portion and opposing the lower PEZ ring; and at least one radiofrequency (RF) power source operative to energize process gas into plasma in an annular space defined by the upper and lower PEZ rings, wherein the annular space encloses the bevel edge.

13 Claims, 8 Drawing Sheets

(51) Int. Cl.
*H01J 37/32* (2006.01)
*H01L 21/67* (2006.01)

(56) References Cited

U.S. PATENT DOCUMENTS

| | | | |
|---|---|---|---|
| 5,213,650 A | 5/1993 | Wang et al. | |
| 5,425,846 A | 6/1995 | Koze et al. | |
| 5,945,351 A | 8/1999 | Mathuni | |
| 6,004,631 A | 12/1999 | Mori | |
| 6,406,589 B1 | 6/2002 | Yanagisawa | |
| 6,436,303 B1 | 8/2002 | Kim et al. | |
| 6,837,963 B2 | 1/2005 | Tanaka et al. | |
| 6,837,967 B1 | 1/2005 | Berman et al. | |
| 7,438,765 B2 | 10/2008 | Park et al. | |
| 7,615,131 B2 | 11/2009 | Lim | |
| 7,858,898 B2 | 12/2010 | Bailey, III et al. | |
| 7,909,960 B2 | 3/2011 | Kim et al. | |
| 7,938,931 B2 | 5/2011 | Sexton et al. | |
| 8,123,901 B2 | 2/2012 | Inada et al. | |
| 2004/0137745 A1 | 7/2004 | Houghton et al. | |
| 2004/0238488 A1 | 12/2004 | Choi et al. | |
| 2005/0173067 A1* | 8/2005 | Lim | 156/345.32 |
| 2005/0178505 A1 | 8/2005 | Kim | |
| 2005/0189068 A1 | 9/2005 | Suzuki et al. | |
| 2005/0263484 A1* | 12/2005 | Park et al. | 216/59 |
| 2006/0086462 A1* | 4/2006 | Inada et al. | 156/345.33 |
| 2006/0278340 A1 | 12/2006 | Fischer | |
| 2007/0068900 A1* | 3/2007 | Kim et al. | 216/67 |
| 2007/0169891 A1* | 7/2007 | Koshiishi et al. | 156/345.47 |
| 2008/0050923 A1 | 2/2008 | Kim et al. | |
| 2008/0156772 A1 | 7/2008 | Kim et al. | |
| 2008/0173401 A1* | 7/2008 | Jeon | 156/345.33 |
| 2008/0179010 A1 | 7/2008 | Bailey, III et al. | |
| 2008/0182412 A1 | 7/2008 | Bailey, III et al. | |
| 2008/0216864 A1* | 9/2008 | Sexton et al. | 134/1.2 |
| 2009/0166326 A1 | 7/2009 | Sexton et al. | |
| 2010/0236717 A1 | 9/2010 | Chung et al. | |

FOREIGN PATENT DOCUMENTS

| | | | |
|---|---|---|---|
| JP | 05114583 A | * | 5/1993 |
| JP | 07-142449 | | 6/1995 |
| KR | 20030002241 | | 1/2003 |
| KR | 1020060016280 A | | 2/2006 |
| KR | 1020060037819 A | | 5/2006 |
| KR | 2007-0001493 | | 1/2007 |
| KR | 1020070066934 A | | 6/2007 |
| WO | WO 2007/038580 A2 | | 4/2007 |

OTHER PUBLICATIONS

Written Opinion dated Dec. 18, 2012 for Singapore Patent Appln. No. 201200496-6.
Notification of Examination Opinion issued Mar. 3, 2014 for Taiwan Patent Appln. No. 98108250.
International Search Report and Written Opinion mailed Apr. 28, 2008 for PCT/US2008/000939.
International Search Report and Written Opinion mailed Sep. 24, 2009 for PCT/US2009/001506.
Official Action issued Apr. 22, 2010 for Chinese Patent Appln. No. 200880003211.3.

* cited by examiner

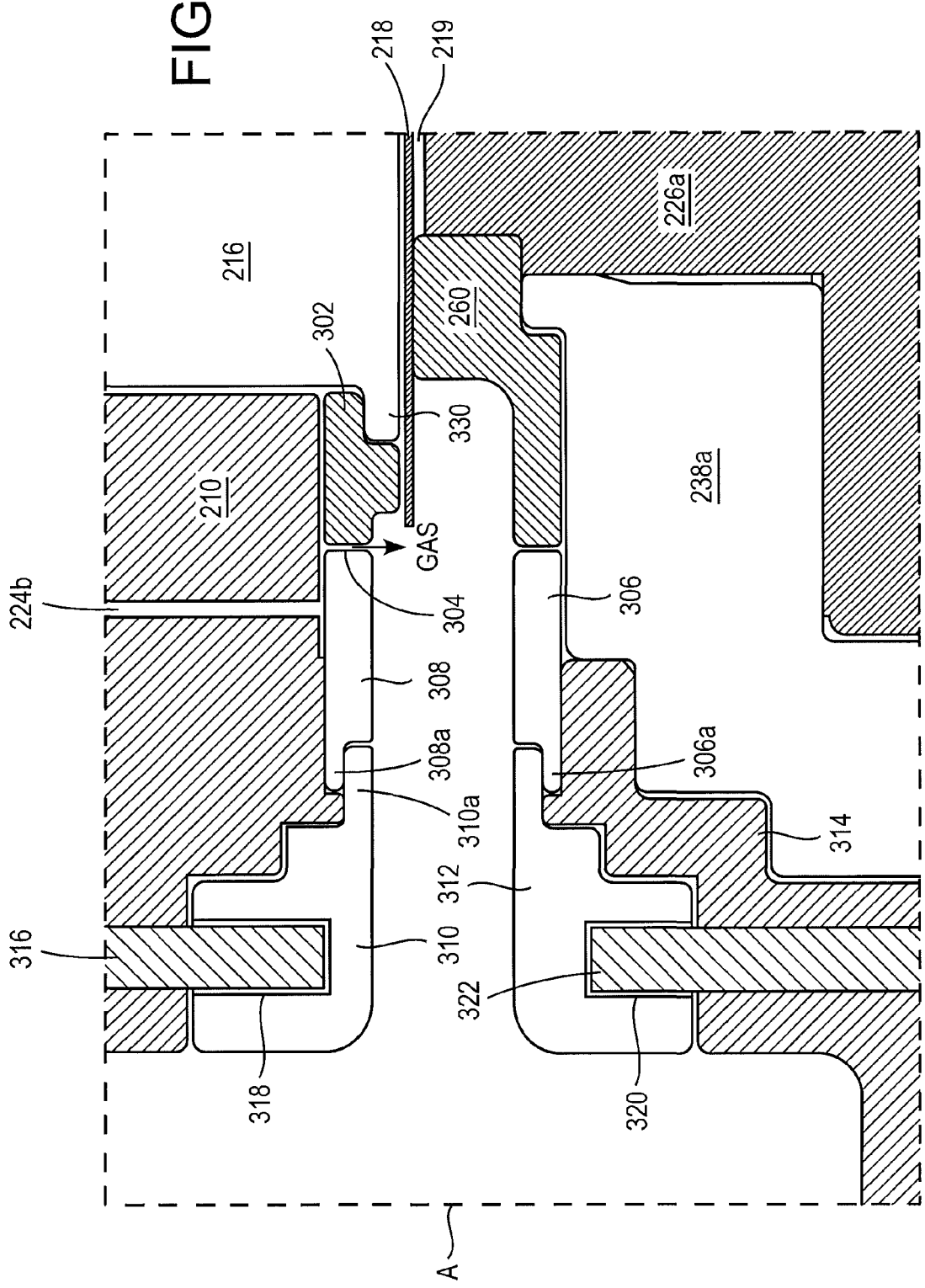

CONFIGURABLE BEVEL ETCHER

CROSS-REFERENCE TO RELATED APPLICATIONS

This application is a continuation application of U.S. application Ser. No. 11/698,190 entitled CONFIGURABLE BEVEL ETCHER, filed on Jan. 26, 2007 now U.S. Pat. No. 7,943,007, the entire content of which is hereby incorporated by reference.

BACKGROUND

Integrated circuits are formed from a wafer or substrate over which are formed patterned microelectronics layers. In the processing of the substrate, plasma is often employed to etch intended portions of films deposited on the substrate. Typically, etch plasma density is lower near the edge of the substrate, which may result in accumulation of a poly-silicon layer, a nitride layer, a metal layer, etc. (collectively referred to as byproduct layer) on the top and bottom surfaces of the substrate bevel edge. As successive byproduct layers are deposited on the top and bottom surfaces of the substrate bevel edge as a result of several different etch processes, the bonds between the byproduct layers and the substrate will eventually weaken and the byproduct layers may peel or flake off, often onto other substrates during substrate transport thereby contaminate the other substrates.

SUMMARY

In accordance with a preferred embodiment, a bevel etcher is provided wherein a bevel edge of a semiconductor substrate is subjected to plasma cleaning using process gas energized into a plasma state. The bevel etcher comprises a lower support having a cylindrical top portion, a lower plasma-exclusion-zone (PEZ) ring supported on the top portion of the lower support, the lower PEZ ring having an upper surface on which the substrate is supported such that the bevel edge of the substrate extends outwardly of an outer edge of the upper surface, an upper dielectric component disposed above the lower support and having a cylindrical bottom portion opposing the top portion of the lower support, an upper PEZ ring surrounding the bottom portion of the dielectric component and opposing the lower PEZ ring, an annular space between the lower and upper PEZ rings limiting the extent of the bevel edge to be cleaned by the plasma, and at least one radio frequency (RF) power source adapted to energize process gas into the plasma during a cleaning operation, wherein the lower and upper PEZ rings are adapted to respectively shield the lower support and the upper dielectric component from the plasma during the cleaning operation.

In accordance with another embodiment, a configurable part of a bevel etcher is provided. The configurable part is a consumable and/or a replaceable part of bevel etcher in which a bevel edge of a semiconductor substrate is subjected to plasma cleaning, the bevel etcher including a lower electrode assembly on which the wafer is supported during the bevel cleaning operation, an upper electrode assembly including a dielectric plate facing the lower support and attached to an upper support which is movable vertically to position the dielectric plate at a small distance from the upper surface of the substrate, the upper electrode assembly including at least one gas passage through which gas can be flowed in the vicinity of the bevel edge during the bevel cleaning operation, and the dielectric plate having at least one gas passage through which gas can be flowed over the surface of the substrate during the bevel cleaning operation. The configurable part comprises at least one of (1) a lower plasma-exclusion-zone (PEZ) ring of electrically conductive, semiconductive or dielectric material adapted to shield the lower support from the plasma during the cleaning operation, (2) an upper PEZ ring of electrically conductive, semiconductive or dielectric material adapted to shield the upper dielectric plate from the plasma during the cleaning operation, (3) an upper ring electrode surrounding the upper PEZ ring, (4) a lower ring electrode surrounding the lower PEZ ring, (5) an upper dielectric ring surrounding the upper ring electrode, and/or (6) a lower dielectric ring surrounding the lower ring electrode.

BRIEF DESCRIPTION OF THE DRAWINGS

FIG. 3 shows an enlarged schematic diagram of region A in FIG. 2.

DETAILED DESCRIPTION

Figure 1:
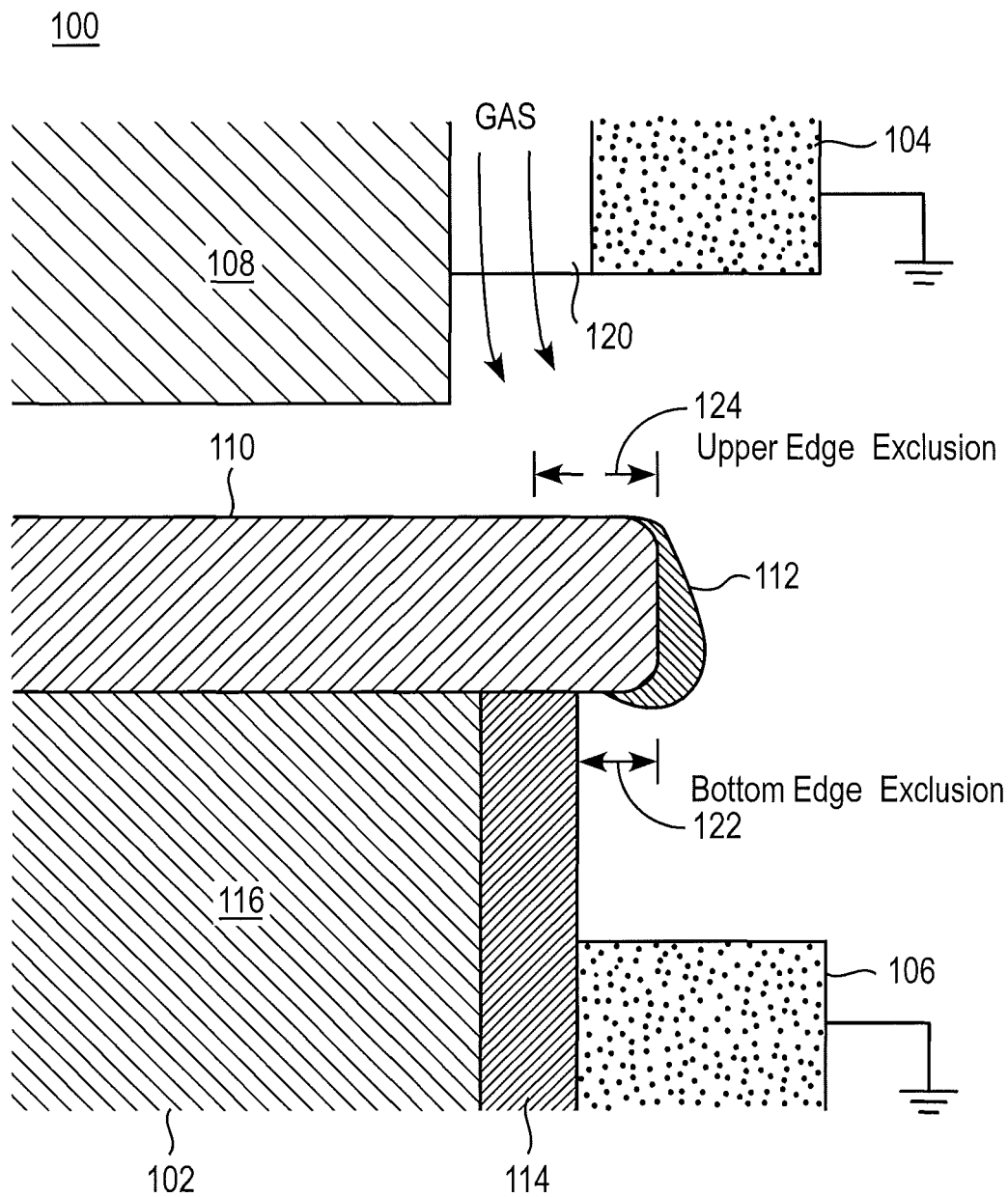
FIG. 1 shows a schematic cross sectional diagram of a bevel etching chamber.

FIG. 1 shows a schematic cross sectional diagram of a bevel etching chamber 100 for etching the bevel edge of a substrate 110. As depicted, the chamber 100 includes a cathode 102 coupled to an RF power source; a stage 116 for supporting a substrate 110; an insulating material 114 surrounding the stage 116; top and bottom ring-shaped electrodes 104, 106; and a top insulator 108. The reaction gas is blown through one or more gas outlets 120 and energized into plasma to clean the byproduct layers 112 formed on the bevel edge of the substrate 110. The etching chamber 100 may have several difficulties in controlling the area to be cleaned. For instance, to change the size of a bottom edge exclusion 122, it may be necessary to change the thickness of the insulating material 114 and, as a consequence, the shape and/or location of the bottom ring-shaped electrode 106 may need to be changed. In some cases, the diameter of the entire stage 116 may need to be changed, which may result in an increase in the Cost-of-Consumables (CoC). Another drawback is that the chamber 100 does not have a mechanism to accurately control the extent of a top edge exclusion 124. To change the extent of the top edge exclusion 124, it may be necessary to change the outer diameter of the insulator 108 as well as the locations of the gas outlet(s) 120 and top ring-shaped electrode 104. As such, it may be costly to accurately control the extent of edge exclusions in such etching chambers.

Figure 2:
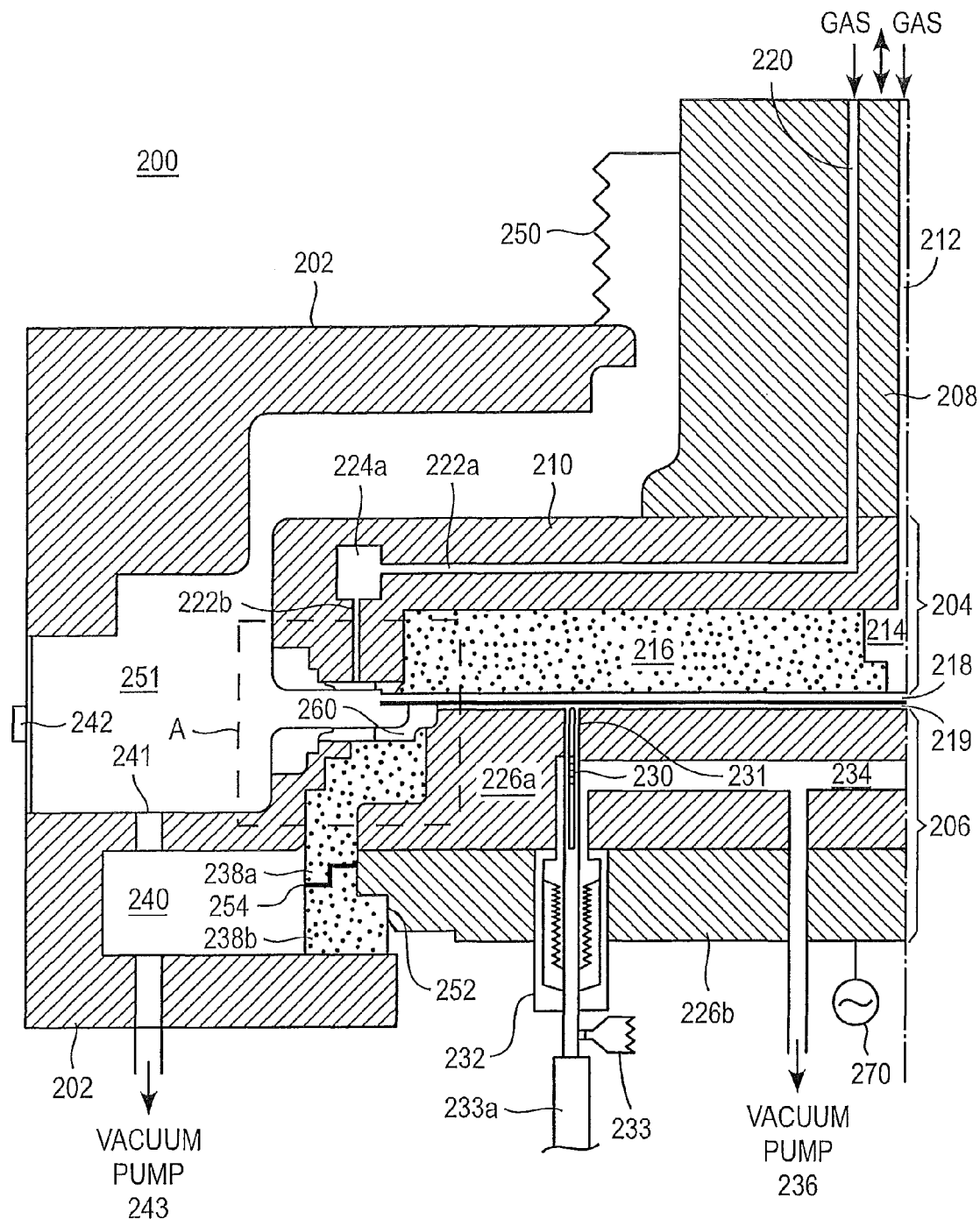
FIG. 2 shows a schematic cross sectional diagram of a bevel etcher in accordance with one embodiment.

Referring now to FIG. 2, there is shown a schematic cross sectional diagram of a substrate etching system or bevel etcher 200 for cleaning the bevel edge of a substrate 218 in accordance with one embodiment. The bevel etcher 200 has a generally, but not limited to, axisymmetric shape and, for brevity, only half of the side cross sectional view is shown in FIG. 2. As depicted, the bevel etcher 200 includes: a chamber wall 202 having a door or gate 242 for through which the substrate 218 is loaded/unloaded; an upper electrode assembly 204; a support 208 from which the upper electrode assembly 204 is suspended; and a lower electrode assembly 206. The support 208 moves the upper electrode assembly 204 up and down (in the direction of the double arrow) for loading/unloading the substrate 218. A precision driving mechanism (not shown in FIG. 2) is attached to the support 208 so that the gap between the upper electrode assembly 204 and the substrate 218 is controlled accurately.

Metal bellows 250 are used to form a vacuum seal between the chamber wall 202 and support 208 while allowing the support 208 to have a vertical motion relative to the wall 202. The support 208 has a center gas feed (passage) 212 and an edge gas feed (passage) 220. The gas feeds 212, 220 provide process gas to be energized into plasma to clean the bevel edge. During operation, the plasma is formed around the bevel edge of the substrate 218 and has a generally ring shape. To prevent the plasma from reaching the central portion of the substrate 218, the space between an insulator plate 226 on the upper electrode and the substrate is small and the process gas is fed from the center feed, preferably through a stepped hole 214. Then, the gas passes through the gap between the upper electrode assembly 204 and the substrate 218 in the radial direction of the substrate. Each gas feed is used to provide the same process gas or other gases, such as buffer gas and/or purge gas. For instance, the buffer gas can be injected through the center gas feed 212, while the process gas can be injected through the edge gas feed 220. The plasma/process gas is withdrawn from the chamber space 251 to the bottom space 240 via a plurality of holes (outlets) 241. During a bevel cleaning operation, the chamber pressure is typically in the range of 500 mTorr to 2 Torr, e.g., a vacuum pump 243 can be used to evacuate the bottom space 240 during a cleaning operation.

The upper electrode assembly 204 includes: an upper dielectric plate or upper dielectric component 216; and an upper metal component 210 secured to the support 208 by a suitable fastening mechanism and grounded via the support 208. The upper metal component 210 is formed of a metal, such as aluminum, and may be anodized. The upper metal component 210 has one or more edge gas passageways or through holes 222a, 222b and an edge gas plenum 224, wherein the edge gas passageways 222 are coupled to the edge gas feed 220 for fluid communication during operation. The upper dielectric plate 216 is attached to the upper metal component 210 and formed of a dielectric material, preferably, but not limited to, ceramic. If desired, the upper dielectric plate 216 may have a coating of $Y_2O_3$. Typically, it is difficult to drill a deep straight hole in some ceramics, such as $Al_2O_3$, and therefore a stepped hole 214 can be used instead of a deep straight hole. While the upper dielectric plate 216 is shown with a single center hole, the upper dielectric plate 216 may have any suitable number of outlets, e.g., the outlets can be arranged in a showerhead hole pattern if desired.

The lower electrode assembly 206 includes: powered electrode 226 having an upper portion 226a and a lower portion 226b and operative to function as a vacuum chuck to hold the substrate 218 in place during operation; lift pins 230 for moving the substrate 218 up and down; a pin operating unit 232; bottom dielectric ring 238 having an upper portion 238a and a lower portion 238b. Hereinafter, the term powered electrode refers to one or both of the upper and lower portions 226a, 226b. Likewise, the term bottom dielectric ring 238 refers to one or both of the upper and lower portions 238a, 238b. The powered electrode 226 is coupled to a radio frequency (RF) power source 270 to receive RF power during operation.

The lift pins 230 move vertically within cylindrical holes or paths 231 and are moved between upper and lower positions by the pin operating unit 232 positioned in the powered electrode 226. The pin operating unit includes a housing around each lift pin to maintain a vacuum sealed environment around the pins. The pin operating unit 232 includes any suitable lift pin mechanism, such as a robot arm 233 (e.g., a horizontal arm having segments extending into each housing and attached to each pin) and an arm actuating device (not shown in FIG. 2). For brevity, only a tip portion of a segment of the robot arm is shown in FIG. 2. While three or four lift pins can be used to lift a wafer such as a 30 mm wafer, any suitable number of pins 230 may be used in the bevel etcher 200. Also, any suitable mechanisms, such as lifter bellows, can be used as the pin operating unit 232.

According to a preferred embodiment, the pin lifter is a multi-position pin lifter which can move the lift pins 230 to various positions. For example, the lift pins 230 can be moved vertically to four positions via the lift pin operating unit 232 as follows: (1) in the first position the pins 230 are moved to locate upper ends thereof below the top surface of the bottom electrode 226, (2) in the second position the pins 230 are moved to locate upper ends thereof in contact with the lower surface of a fixture installed with its bottom surface in the same plane as a wafer supported on the ring 260 and this position is monitored via a position sensor 233a which outputs a signal to a controller to record the position as a "zero" position, (3) in the third position the pins 230 are moved to locate upper ends thereof in contact with the dielectric plate 216 and this position is monitored via the position sensor 233a which outputs a signal to the controller to determine gap and planarity information without having to open the chamber, and (4) in the fourth position the pins 230 are moved to their full up position to allow transfer of a wafer to be cleaned into the chamber or transfer of a cleaned wafer out of the chamber.

For minimizing costs of manufacture, the lift pins are preferably moved by a common lift device such as an air cylinder or motor. In such case, the gap distance could be determined when a pin contacts the dielectric plate on the upper electrode assembly. For planarity measurement, each pin could be provided with some compliance relative to the common lifting yoke, e.g., each pin could be spring loaded to allow movement of each pin relative to the other pins and an individual sensor associated with each pin could output information corresponding to an individual pin's position. By moving all of the pins into contact with the dielectric plate, if the dielectric plate is not parallel with the substrate support surface, the vertical offset of each pin relative to the other pins measured by the lift pin sensors could be used to determine the degree of out of planarity of the upper electrode assembly. Preferably, the spring load on each lift pin is sufficient to support the weight of a wafer, i.e., the springs supporting the lift pins would not be compressed under the weight of the wafer so that during wafer transfer the lift pins are at the same height relative to each other. Alternatively, the pins could have independent drives.

The substrate 218 is mounted on a lower configurable plasma-exclusion-zone (PEZ) ring 260, wherein the term PEZ refers to a radial distance from the center of the substrate to the outer edge of the area where the plasma for cleaning the bevel edge is excluded. The top surface of the powered electrode 226, the bottom surface of the substrate 218, and inner periphery of the lower configurable PEZ ring 260 form an enclosed vacuum region recess (vacuum region) 219 in fluid communication with a vacuum source such as a vacuum pump 236. The cylindrical holes or paths for the lift pins 230 are also shared as gas passageways, through which the vacuum pump 236 evacuates the vacuum region 219 during operation. The powered electrode 226 includes a plenum 234 to reduce temporal pressure fluctuations in the vacuum region 219 and, in cases where multiple lift pins are used, to provide a uniform suction rate for the cylindrical holes.

On the top surface of the substrate 218 are integrated circuits formed by a series of processes. One or more of the processes may be performed by use of plasma that may transfer heat energy to the substrate, developing thermal stress on the substrate and thereby causing wafer bowing. During a bevel cleaning operation, the substrate bowing can be reduced by use of a pressure difference between the top and bottom surfaces of the substrate 218. The pressure in the vacuum region 219 is maintained under vacuum during operation by a vacuum pump 236 coupled to the plenum 234. By adjusting the gap between the upper dielectric plate 216 and the top surface of the substrate 218, the gas pressure in the gap can be varied without changing the overall flow rate of the process gas(es). Thus, by controlling the gas pressure in the gap, the pressure difference between the top and bottom surfaces of the substrate 218 can be varied and thereby the bending force applied on the substrate 218 can be controlled.

The bottom dielectric ring 238 is formed of a dielectric material, such as ceramic including $Al_2O_3$, and electrically separates the powered electrode 226 from the chamber wall 202. The lower portion 238b of the bottom dielectric ring preferably has a step 252 formed on the inner periphery of its upper surface to mate with a recess on a lower edge of the powered electrode 226. The lower portion 238b preferably has a step 254 formed on its outer periphery to mate with a stepped surface on the upper portion 238a of the bottom dielectric ring, referred to as a focus ring. The steps 254, 252 align the bottom dielectric ring 238 with the powered electrode 226. The step 250 also forms a tortuous gap along the surface thereof to eliminate the direct line-of-sight between the powered electrode 226 and the chamber wall 202 thereby reducing the possibility of a secondary plasma strike between the powered electrode 226 and the chamber wall 202.

FIG. 3 shows an enlarged schematic diagram of region A in FIG. 2. As depicted, the upper electrode assembly 204 includes three concentrically positioned rings: an upper configurable PEZ ring 302; an upper electrode ring 308; and an outer upper dielectric ring 310. The gap 304 between the upper configurable PEZ ring 302 and the upper electrode ring 308 forms a tortuous gas passageway connected to the edge gas passageway 224b. The tortuous gap 304 prevents the edge gas passageway 224b from being directly exposed to plasma thereby preventing formation of secondary plasma or plasma light-up within the edge gas passageway 224b. Such secondary plasma could erode the inner wall of the edge gas passageway 224b and result in need of frequent replacements of the upper metal component 210 as well as introduce eroded material to the substrate 218.

Figure 4A:
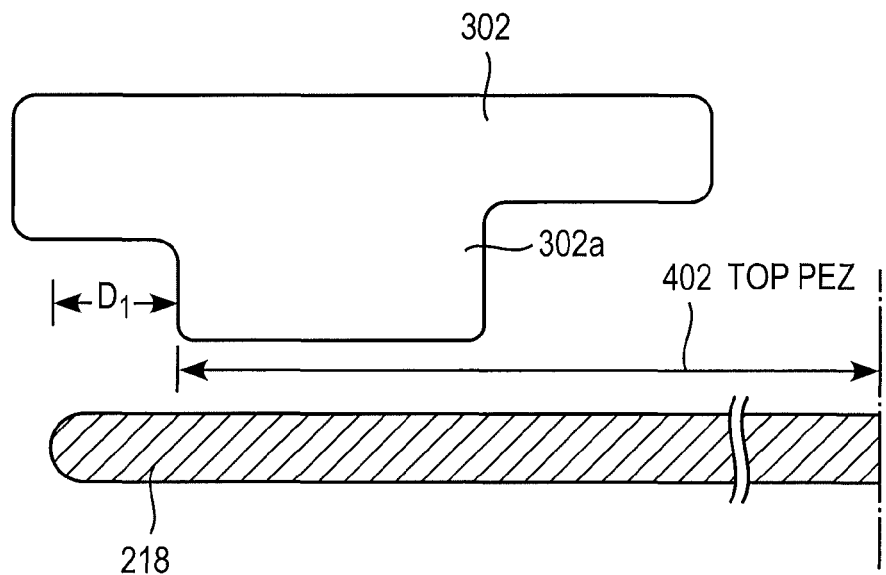
FIGS. 4A-4B show schematic cross sectional diagrams of the configurable plasma exclusion zone (PEZ) rings in FIG. 2.

The upper configurable PEZ ring 302 has two steps or recesses respectively formed on its inner and outer lower edges, wherein the step on the inner lower edge engages a flange 330 of the upper dielectric plate 216 to clamp the ring 302 against metal component 210. The upper configurable PEZ ring 302 can have various configurations to provide different top plasma exclusion zones (top PEZ). FIG. 4A shows an enlarged schematic cross sectional view of the upper configurable PEZ ring 302 shown in FIG. 3, wherein the distance $D_1$ is referred to as top edge exclusion zone and varies with changes in width of lower portion 302a of the ring 302. The configuration of the PEZ ring 302 thus determines the top PEZ 402 that is equal to the radius of the substrate 218 minus the distance $D_1$. The upper configurable PEZ ring 302 also needs to be replaced more frequently than the other parts of the upper electrode assembly 204 due to plasma erosion and is considered a consumable component. Typically, process gases may include an oxygen-containing gas, such as $O_2$. Small amounts, such as <10%, of a fluorine-containing gas, such as $CF_4$, $SF_6$, or $C_2F_6$, may also be added to clean the bevel edge. Plasma containing these reactive gases may erode the upper PEZ ring 302, and thereby necessitate periodic replacement of the upper configurable PEZ ring 302. For easy access to the upper configurable PEZ ring 302 during replacement, the upper configurable PEZ ring 302 is held in place by the upper dielectric plate 216 and can be replaced without removing the upper electrode assembly 204 from the chamber wall 202. For example, removal of the plate 216 allows ring 302 to be replaced with a different ring having the same or different configuration.

The upper configurable PEZ ring 302 prevents the plasma from directly eroding the upper dielectric plate 216. The upper configurable PEZ ring 302 is formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or it can be a composite ring of metal, ceramic or polymer coated with a conductive or dielectric material such as Si, SiC or $Y_2O_3$, ceramic (preferably $Al_2O_3$), or pure material, such as CVD SiC (doped suitably to provide high resistivity), to reduce contamination of the substrate 218 during operation. To reduce the Cost-of-Consumables (CoC), the upper configurable PEZ ring 302 preferably has a small and simple cross section. In general, it is difficult to drill and tap threaded holes in some ceramics. Due to the clamping arrangement for holding the ring 302 in place, the upper configurable PEZ ring 302 does not require threaded holes for it to be secured to the upper dielectric plate 216 or to metal component 210, thus providing flexibility in selecting the material therefore. The upper configurable PEZ ring 302 may be formed of a material having a high electrical resistance, preferably, but not limited to, ~105 ohm-cm. As the electrical coupling between the powered electrode 226 and the upper electrode ring 308 is affected by the electrical properties of the upper configurable PEZ ring 302, the plasma characteristics in the vicinity of the bevel edge can be controlled by varying the material and/or configuration of the upper configurable PEZ ring 302.

The upper electrode ring 308 is connected to and grounded via the upper metal component 210. Instead of using threaded fastening mechanisms, such as bolts, the upper electrode ring 308 is preferably held in place by the clamping force of the outer upper dielectric ring 310. For example, electrode ring 308 can have a flange 308a which mates with flange 310a on the dielectric ring 310. As such, plasma contaminants that would otherwise originate from the erosion of the exposed fastening mechanisms can be obviated. The upper electrode ring 308 is preferably formed of a metal, such as anodized aluminum. In cases where a cleaner plasma is required, the upper electrode ring 308 can be formed of pure materials such as Si (single crystal or polycrystalline silicon), CVD low resistivity SiC or any suitable high-purity conductive materials. To minimize the cost impact of using high-purity materials, the cross sectional dimension of the upper electrode ring 308 is minimized. Although a bolt-through design could be used, a clamp-in-place design simplifies the configuration of the upper electrode ring 308 to thereby lower the CoC and allow the use of a wider range of materials for contamination control. It is also noted that the lower and upper electrode rings 306, 308 may be formed of graphite or various carbon based materials including SiN, BN, and AlN, for instance.

The outer upper dielectric ring 310 is formed of a dielectric material, such as $Al_2O_3$, and may be coated with $Y_2O_3$. The outer upper dielectric ring 310 includes circumferentially spaced apart threaded holes 318 in its upper surface to receive bolts 316 for securing the outer upper dielectric ring 310 to the upper metal component 210. The outer upper dielectric ring 310 includes a protrusion or step (flange) 310a that is used to clamp a flange 308a of the upper electrode ring 308 to the upper metal component 210. It is noted that each bolt 316 is screwed from the top side of the upper electrode assembly 204 so that the bolts are not exposed to and eroded by the plasma. The inner edge diameter of the outer upper dielectric ring 310 determines the outer diameter of the ring or donut shaped plasma.

The lower electrode assembly 206 includes a lower metal liner (collar) 314 which surrounds focus ring 238a and three concentrically positioned rings: a lower configurable PEZ ring 260; a lower electrode ring or hoop ring 306; and an outer lower dielectric ring 312. The lower configurable PEZ ring 260, lower electrode ring 306, and lower metal liner 314 are supported by the bottom dielectric ring or focus ring 238 (more specifically, the upper portion 238a of the bottom dielectric ring) and liner 314. The lower electrode ring 306 is clamped against an upper surface of the lower metal liner 314 by the outer lower dielectric ring 312, wherein the lower metal liner 314 is connected to the chamber wall 202 for grounding. The focus ring 238a electrically separates the lower electrode ring 306 from the upper portion 226a of the powered electrode.

The powered electrode 226 is preferably formed of a metal, such as anodized aluminum. If the powered electrode 226 is exposed to and eroded by the plasma in cases where high cleanness plasma is required, it would be desirable to use a high purity material for the electrode 226 to meet the cleanness requirement. Because the lower configurable PEZ ring 260 is designed to shield the powered electrode 226 from the plasma, the powered electrode 226 can be formed of lower purity metals or materials regardless of the cleanness requirement.

Figure 4B:
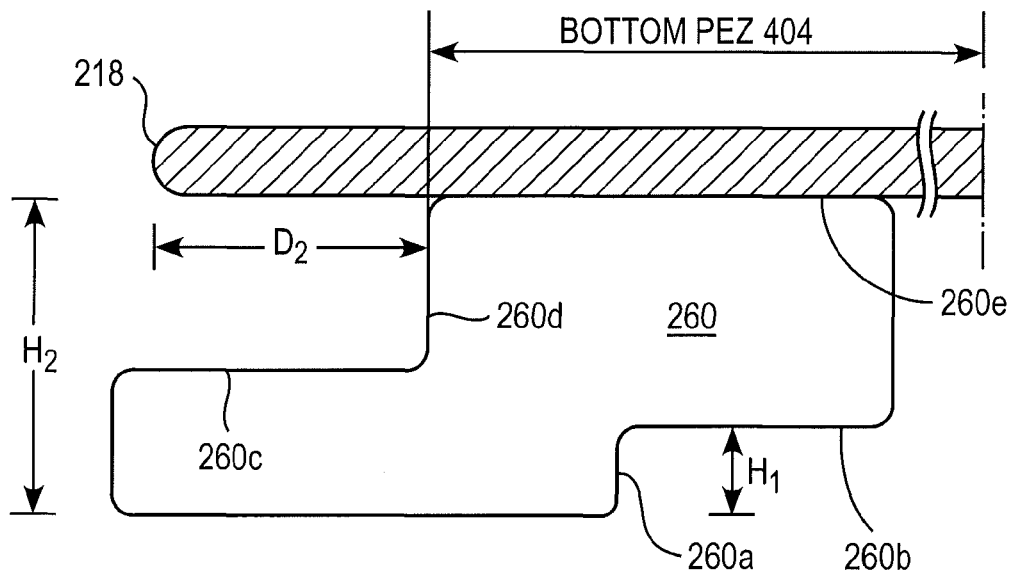

As shown in FIG. 4B, the lower configurable PEZ ring 260 has two recesses or steps respectively formed on its inner and outer edges, wherein the step formed by vertical surface 260a and the horizontal surface 260b on the lower inner edge mates with surfaces on the outer edge of the upper portion 226a of the powered electrode and a step formed by horizontal surface 260c and vertical surface 260d mate with surfaces on the focus ring 238a. The lower configurable PEZ ring 260 can be replaced with a PEZ ring providing a different sized bottom plasma exclusion zone. The distance $D_2$ formed by the second step is referred to as bottom edge exclusion zone and by varying the width of upper surface 260e it is possible to change the bottom PEZ 404 which is equal to the radius of the substrate 218 minus the distance $D_2$. Due to plasma erosion, the lower configurable PEZ ring 260 will be replaced more frequently than the other parts of the lower electrode assembly 206 and considered as a consumable component. Typically, process gases may include an oxygen-containing gas, such as $O_2$. Small amounts, such as <10%, of a fluorine-containing gas, such as $CF_4$, $SF_6$, or $C_2F_6$, may also be added to clean the bevel edge. Plasma containing these reactive gases may erode the lower configurable PEZ ring 260, necessitating periodic replacement of the lower configurable PEZ ring 260. For easy access to the lower configurable PEZ ring 260 during replacement, the lower configurable PEZ ring 260 is removably mounted on the steps of the upper portion 226a of the powered electrode and the focus ring 238a, and can be replaced without removing the lower electrode assembly 206 from the chamber wall 202.

As discussed above, the substrate 218 is mounted on the upper surface 206e (FIG. 4B) of the lower configurable PEZ ring 260. The heights $H_1$ and $H_2$ determine the vertical separation between the substrate 218 and powered electrode 226. For repeatable alignment therebetween, the heights $H_1$ and $H_2$ are preferably precisely controlled.

The lower configurable PEZ ring 260 protects the powered electrode 226 from attack by the plasma used to effect the bevel cleaning. The lower configurable PEZ ring 260 is formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or it can be a composite ring of metal, ceramic or polymer coated with a conductive or dielectric material such as Si, SiC or $Y_2O_3$, e.g., a ceramic (preferably $Al_2O_3$), or pure material, such as Si (single crystal or polycrystalline silicon), CVD high resistivity SiC or the like, to reduce contamination of the substrate 218 during a cleaning operation. In general, it is difficult to drill and tap threaded holes in some ceramics. The lower configurable PEZ ring 260 does not require threaded holes to be secured to the focus ring 238a, providing flexibility in selecting the material therefore. The lower configurable PEZ ring 260 may be also formed of a material having a high electrical resistance, preferably, but not limited to, ~105 ohm-cm. As the electrical coupling between the powered electrode 226 and the lower electrode ring 306 is affected by the electrical properties of the lower configurable PEZ ring 260, the plasma characteristics can be controlled by varying the material and/or configuration of the lower configurable PEZ ring 260.

The lower electrode ring 306 is connected to and grounded via the lower metal liner 314. Instead of using threaded fastening mechanisms, such as bolts, the lower electrode ring 306 is preferably held in place by the clamping force of the outer lower dielectric ring 312. For example, an outer flange 306a on the electrode ring 306 can be engaged with an inner flange 312a on the dielectric ring 312 whereby electrode ring 306 is clamped against the liner 314. As such, plasma contaminants that might otherwise originate from erosion of exposed fastening mechanisms can be obviated. The lower electrode ring 306 is preferably formed of a metal, such as anodized aluminum. In cases where a cleaner plasma is required, the lower electrode ring 306 may be formed of high purity materials such as pure Si (e.g., single crystal or polycrystalline silicon), CVD low resistivity SiC or any suitable high-purity conductive materials. To minimize the cost impact of using high-purity materials, the cross sectional dimensions of the lower electrode ring 306 can be minimized. Use of a clamp-in-place design simplifies the configuration of lower electrode ring 306 and thereby lowers the CoC through use of a wider range of materials for contamination control.

The outer lower dielectric ring 312 is formed of a dielectric material, such as $Al_2O_3$, and may be coated with $Y_2O_3$. The outer lower dielectric ring 312 includes a series of threaded holes 320 which receive bolts 322 for securing the outer lower dielectric ring 312 to the lower metal liner 314. As discussed above, the outer lower dielectric ring 312 includes a protrusion or step (flange) that is used to clamp the lower electrode ring 306 to the metal liner 314. It is noted that the bolts 322 are screwed from the bottom side of the lower electrode assembly 206 so that the bolts 322 are not exposed to and eroded by the plasma. The inner edge diameter of the outer lower dielectric ring 312 determines the outer diameter of the ring or donut shaped plasma.

Figure 5A:
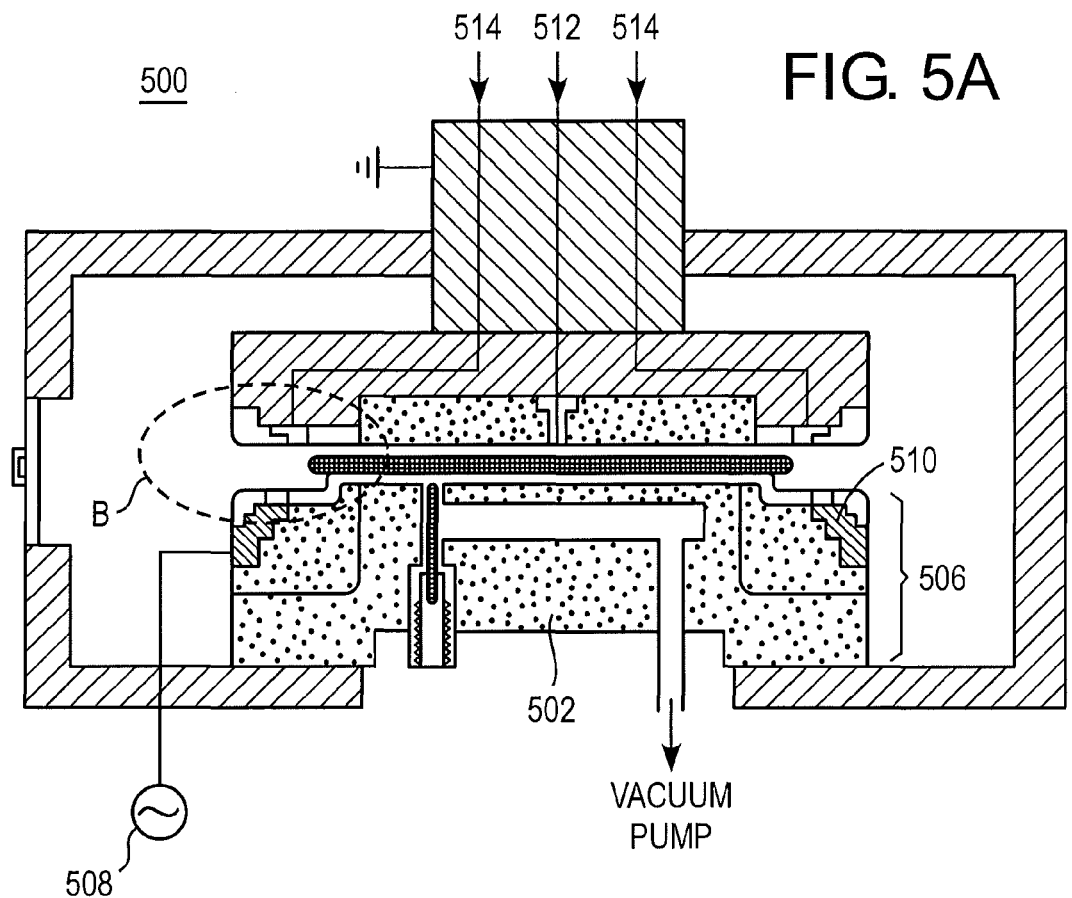
FIG. 5A shows a schematic cross sectional diagram of a bevel etcher in accordance with another embodiment.
Figure 5B:
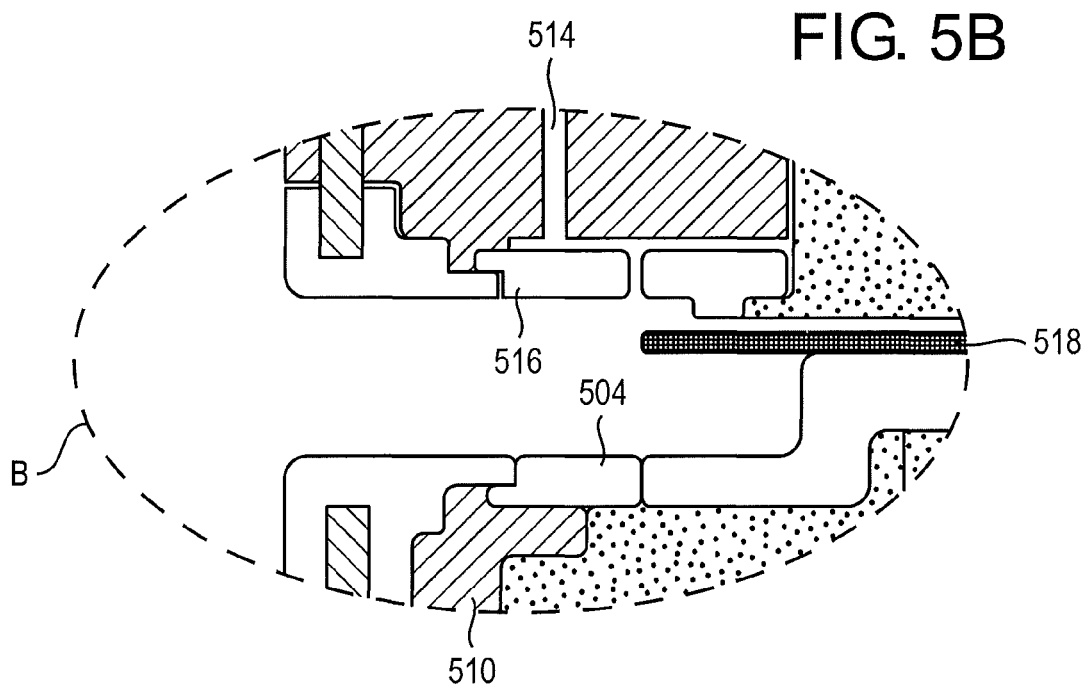
FIG. 5B shows an enlarged schematic diagram of region B in FIG. 5A.

FIG. 5A shows a schematic cross sectional diagram of a bevel etcher 500 in accordance with another embodiment. FIG. 5B shows an enlarged schematic diagram of region B in FIG. 5A. As depicted, the components of the bevel etcher 500 are quite similar to those shown in FIG. 2. The differences are that the lower electrode assembly 506 includes a lower support 502 in place of the powered electrode 226 and the lower electrode ring 504 is coupled to an RF power source 508 via the lower metal liner 510. The lower support 502 is formed of a dielectric material and operates as a vacuum chuck to hold the substrate 518 in place during a bevel cleaning operation.

During operation, the RF power source 508 provides RF power to energize process gas provided through at least one of the gas feeds 512, 514 into plasma, wherein the RF power is supplied in one or more frequencies in a range, but not limited to, of ~2 MHz to ~13 MHz. In a variation, the upper electrode ring 516 is coupled to an RF power source while the lower electrode ring 504 is grounded.

Figure 6:
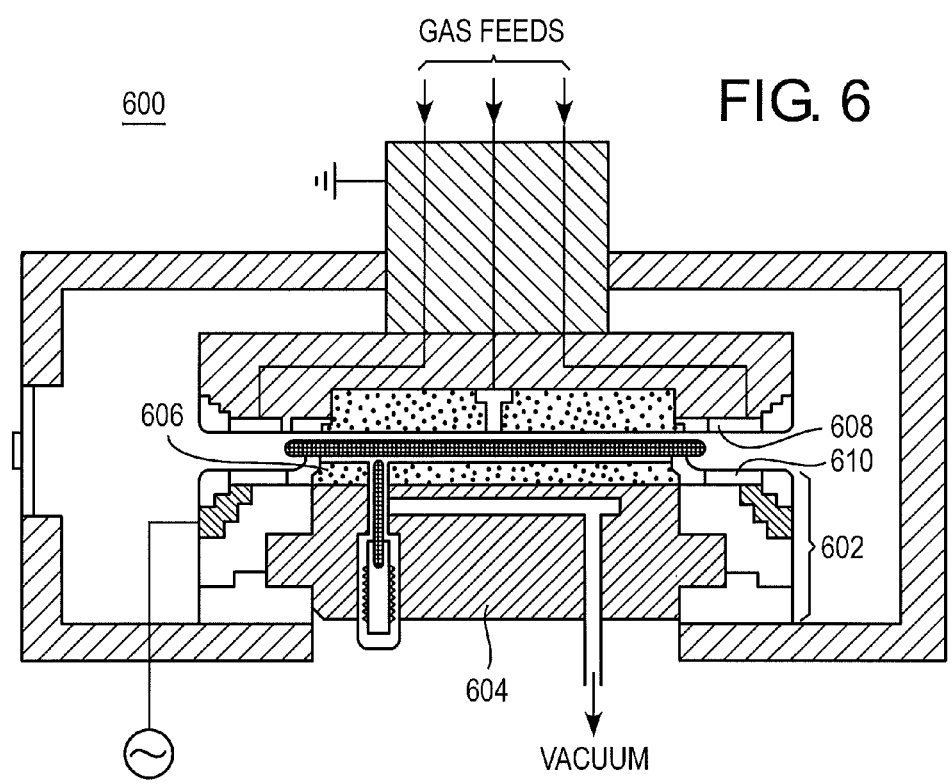
FIG. 6 shows a schematic cross sectional diagram of a bevel etcher in accordance with yet another embodiment.

FIG. 6 shows a schematic cross sectional diagram of a bevel etcher 600 in accordance with yet another embodiment. The components of the bevel etcher 600 are similar to those shown in FIGS. 5A and 5B. The difference is that the lower electrode assembly 602 includes a lower support 604 formed of a metal and the upper surface of lower support 604 is covered with a dielectric coating or layer 606. In a variation, the upper electrode ring 608 is coupled to an RF power source while the lower electrode ring 610 is grounded.

Figure 7:
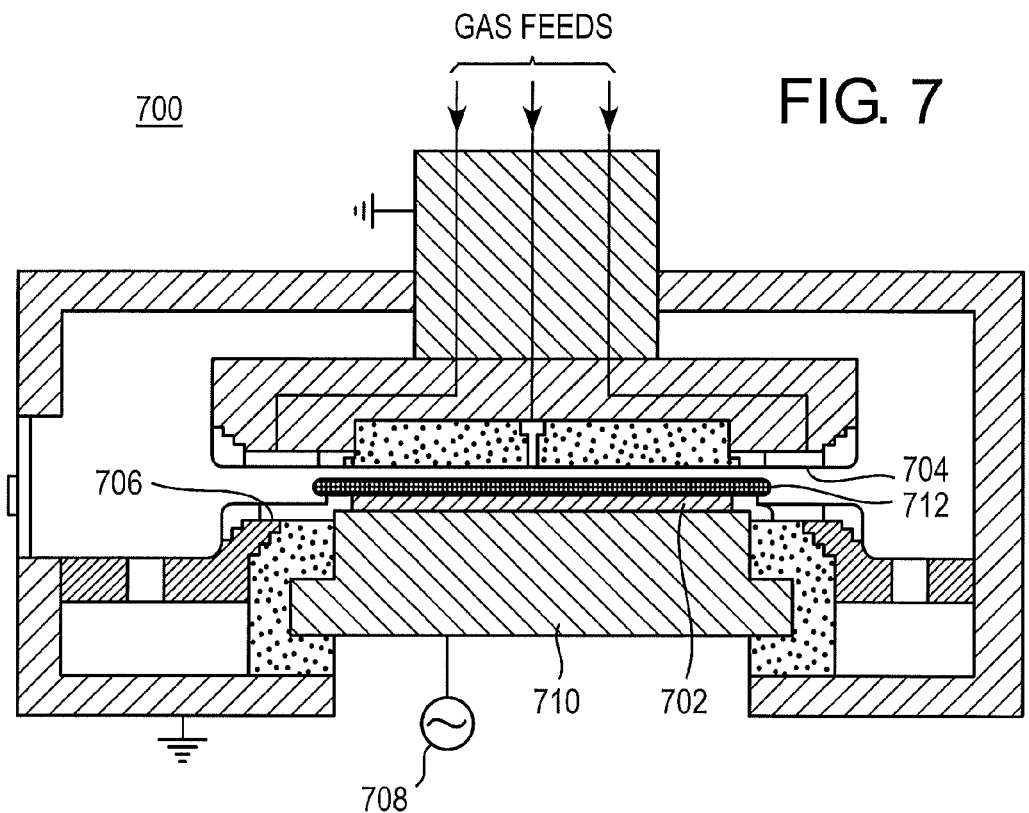
FIG. 7 shows a schematic cross sectional diagram of a bevel etcher in accordance with a further embodiment.

FIG. 7 shows a schematic cross sectional diagram of a bevel etcher 700 in accordance with a further embodiment. As depicted, the components of the bevel etcher 700 are similar to those shown in FIG. 2, with the difference that an electrostatic chuck 702 is used in place of the vacuum chuck. The electrostatic chuck 702 is disposed on a powered electrode 710 and holds a substrate 712 in place during a bevel cleaning operation. Upper and lower electrode rings 704, 706 are grounded while the powered electrode 710 is coupled to an RF source 708 for supplying power to generate the plasma.

Figure 8:
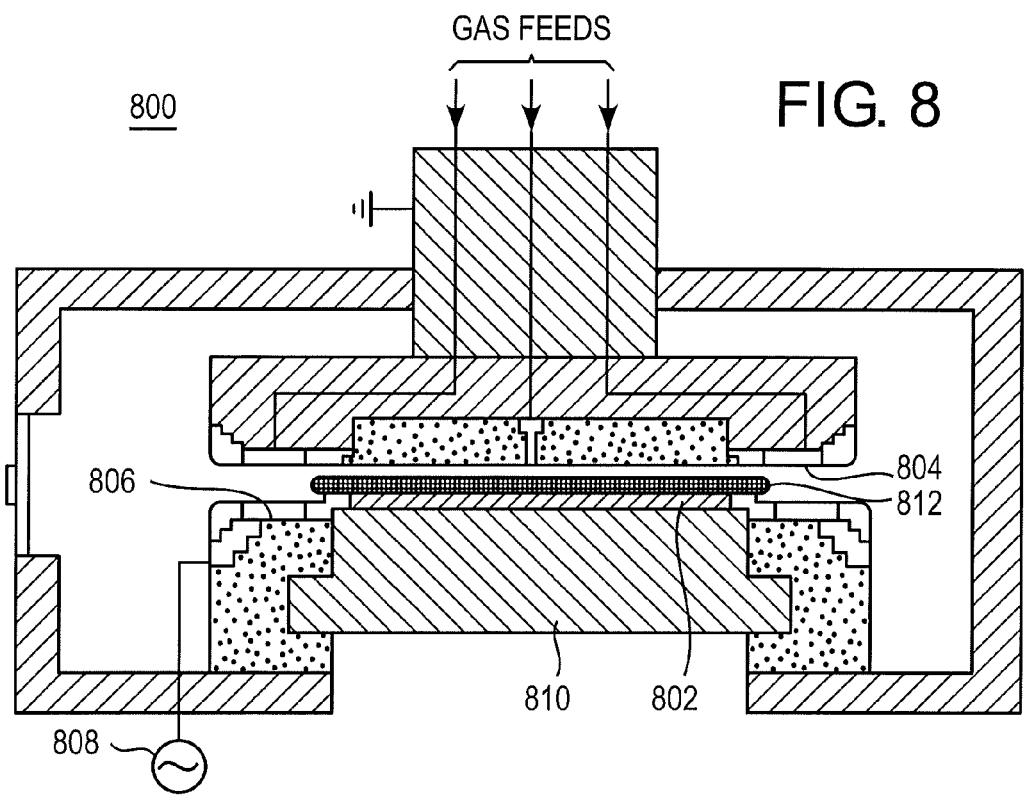
FIG. 8 shows a schematic cross sectional diagram of a bevel etcher in accordance with another further embodiment.

FIG. 8 shows a schematic cross sectional diagram of a bevel etcher 800 in accordance with another embodiment. As depicted, the components of the bevel etcher 800 are similar to those in FIG. 7, i.e., an electrostatic chuck 802 is used to hold a substrate 812 in place during a bevel cleaning operation. The difference is that the upper electrode ring 804 is grounded while the lower electrode ring 806 is coupled to an RF power source 808 for supplying RF power to generate the plasma. In a variation, the upper electrode ring 804 is coupled to an RF power source while the lower electrode ring 806 is grounded.

Figure 9:
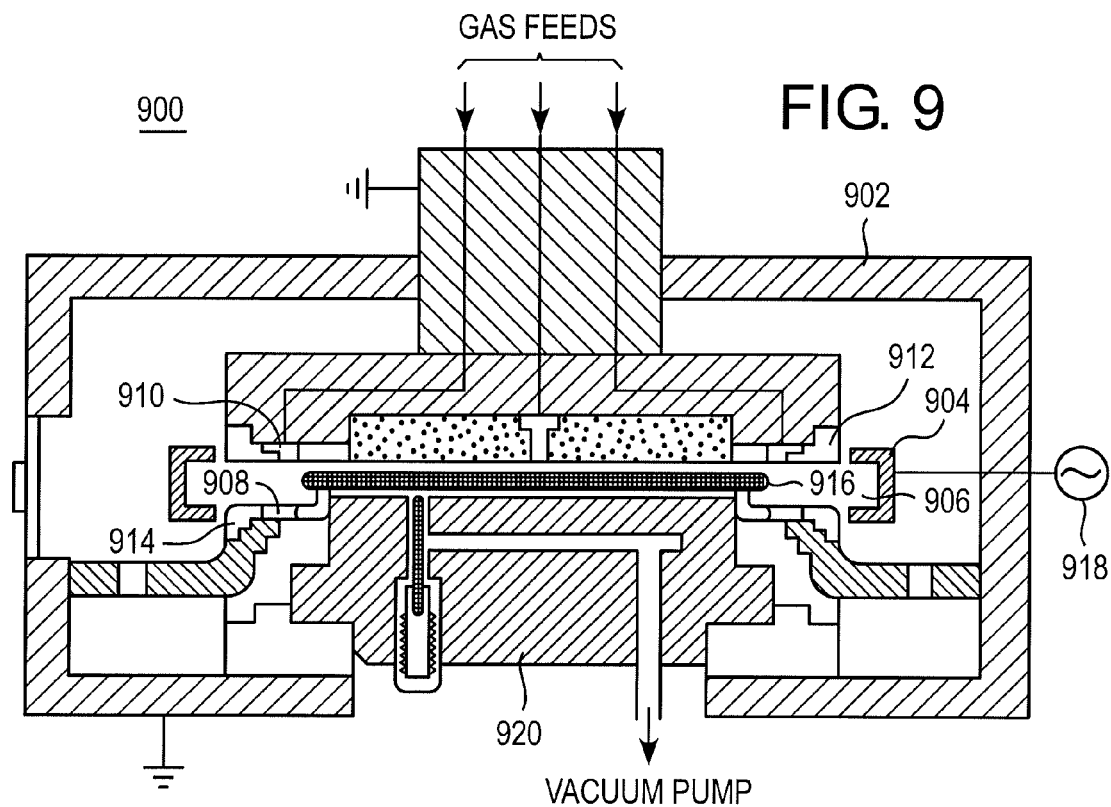
FIG. 9 shows a schematic cross sectional diagram of a bevel etcher in accordance with a yet further embodiment.

FIG. 9 shows a schematic cross sectional diagram of a bevel etcher 900 in accordance with yet a further embodiment. The components in the etcher 900 are similar to those shown in FIG. 2. The difference is that, in this embodiment, a hollow cathode ring 904, which is made of a conductive material, such as aluminum, is located outside the outer upper and lower dielectric rings 912, 914. The hollow cathode ring 904 has a channel 906 that faces the bevel edge. It is noted that the hollow cathode ring 904 is moved in a vertical direction during loading/unloading a substrate 916 by a suitable device (not shown in FIG. 9).

The hollow cathode ring 904 is coupled to an RF power source 918 and both lower and upper electrode rings 908, 910 are grounded. The RF power source supplies RF power in a frequency range from ~2 MHz to ~13 MHz, for instance. In a variation, the upper electrode ring 910 is coupled to an RF power source while the lower electrode ring 908 and the hollow cathode ring 904 are grounded. In another variation, the lower electrode ring 908 is coupled to an RF power source while the upper electrode ring 910 and the hollow cathode ring 904 are grounded. In yet another variation, the hollow cathode ring 904 is also coupled to a high-frequency RF power source to generate plasma for cleaning the interior of the chamber 902 and the top surface of the vacuum chuck 920, wherein the high-frequency RF power source provides RF power in the range from ~27 MHz to ~60 MHz, for instance.

Figure 10:
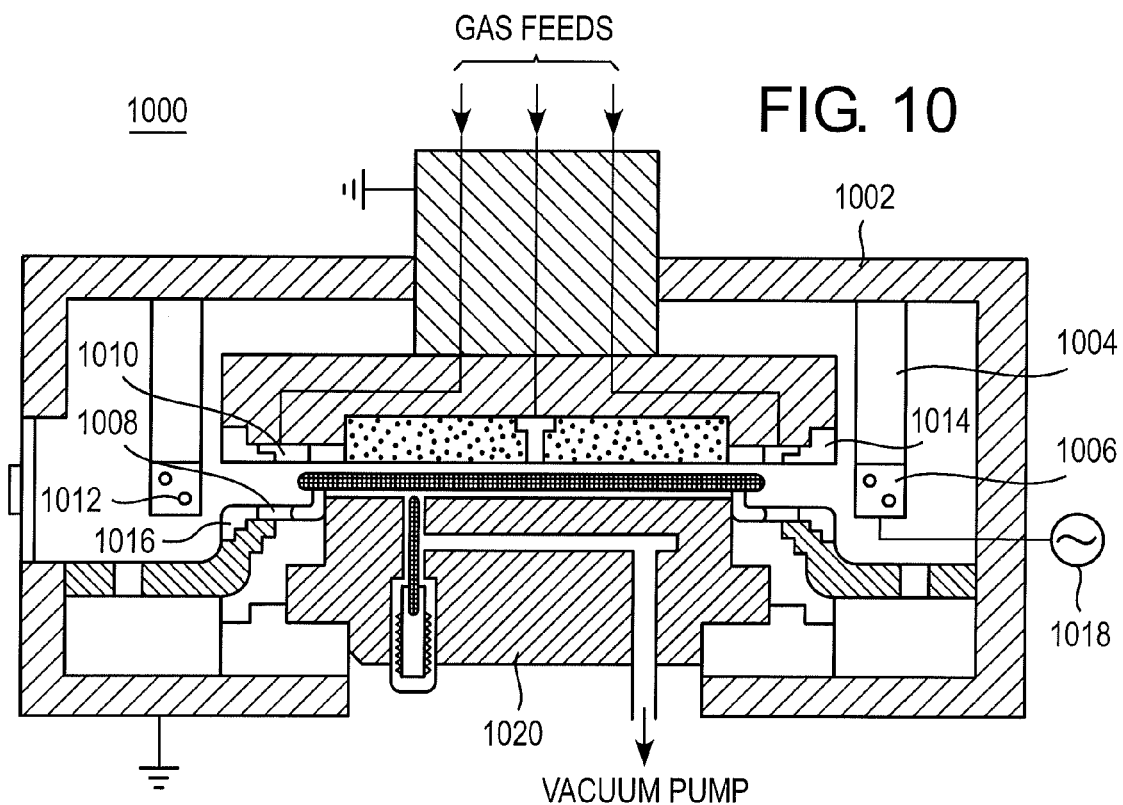
FIG. 10 shows a schematic cross sectional diagram of a bevel etcher in accordance with a still further embodiment.

FIG. 10 shows a schematic cross sectional diagram of a bevel etcher in accordance with a further embodiment. The components of the bevel etcher 1000 are similar to those shown in FIG. 2. The difference is that an inductive coil(s) 1012 surrounds the substrate edge and the space between the outer lower dielectric ring 1016 and the outer upper dielectric ring 1014. The inductive coil(s) 1012 is embedded in a dielectric material 1006 that is coupled to a dielectric support 1004. The dielectric support 1004 includes a suitable mechanism (not shown in FIG. 10) for moving the inductive coil 1012 in a vertical direction during loading/unloading a substrate.

The inductive coil 1012 is coupled to an RF power source 1018. During the bevel edge cleaning process, the RF power source 1018 supplies RF power in a range, but not limited to, of ~2 MHz to ~13 MHz to generate an inductively coupled plasma near the substrate edge. The upper electrode ring 1010 and the lower electrode ring 1008 are grounded to provide a return path for the inductive plasma. The inductive coil 1012 provides cleaning plasma to clean the bevel edge. In a variation, the inductive coil 1012 is also coupled to a high-frequency RF power source to generate plasma for cleaning the interior of the chamber 1002 and the top surface of the vacuum chuck 1020, wherein the high-frequency RF power source provides RF power in the range of ~27 MHz to ~60 MHz, for instance.

It is noted that the embodiments in FIGS. 2 and 6-10 have a center gas feed and edge gas feeds. However, the number of gas feeds may be varied to achieve a desired distribution of gas to the substrate and/or vicinity of the bevel edge. Also, the upper dielectric plate may have any suitable number and disposition of holes.

While the invention has been described in detail with reference to specific embodiments thereof, it will be apparent to those skilled in the art that various changes and modifications can be made, and equivalents employed, without departing from the scope of the appended claims.

What is claimed is:

1. A bevel etcher wherein a bevel edge of a semiconductor substrate is subjected to plasma cleaning, comprising:
    a lower support having a cylindrical top portion;
    a lower plasma-exclusion-zone (PEZ) ring supported on the top portion of the lower support, the lower PEZ ring having an upper surface, a step on a lower inner edge which mates with an outer edge of the lower support, and a step on an upper outer edge which is configured to underlie the semiconductor substrate;
    an upper dielectric component disposed above the lower support and having a cylindrical bottom portion opposing the top portion of the lower support;
    an upper PEZ ring surrounding the bottom portion of the dielectric component and opposing the lower PEZ ring, an annular space between the lower and upper PEZ rings limiting the extent of the bevel edge to be cleaned by the plasma;

at least one radio frequency (RF) power source adapted to energize process gas into the plasma during a cleaning operation;

wherein the lower and upper PEZ rings are adapted to respectively shield the lower support and the upper dielectric component from the plasma during the cleaning operation.

2. The bevel etcher as recited in claim 1, wherein the at least one RF power source includes:

a lower electrode ring surrounding the lower PEZ ring; and an upper electrode ring surrounding the upper PEZ ring and opposing the lower electrode ring.

3. The bevel etcher as recited in claim 2, wherein (a) the lower and upper electrode rings are grounded and the lower support is coupled to a radio frequency (RF) power generator supplying RF power to generate the plasma; (b) the lower electrode ring is grounded and the upper electrode ring is coupled to a radio frequency (RF) power generator supplying RF power to generate the plasma; or (c) the upper electrode ring is grounded and the lower electrode ring is coupled to a radio frequency (RF) power generator supplying RF power to generate the plasma.

4. The bevel etcher as recited in claim 3, wherein the top portion of the lower support is formed of a dielectric material.

5. The bevel etcher as recited in claim 2, further comprising:

an upper metal component overlying the upper dielectric component, the upper electrode ring and upper PEZ ring;

an upper dielectric ring surrounding the upper electrode ring and secured to the upper metal component, the upper dielectric ring including a flange clamping the upper electrode ring to the upper metal component;

a lower metal liner underlying the lower electrode ring;

a lower dielectric ring surrounding the lower electrode ring and secured to the lower metal liner, the lower dielectric ring including a flange clamping the lower electrode ring to the lower metal liner; and a focus ring interposed between the lower support and the lower metal liner and adapted to electrically separate the lower support from the lower metal liner and from the lower electrode ring.

6. The bevel etcher as recited in claim 5, wherein the upper metal component includes at least one gas passage adapted to be coupled to a gas source containing process gas, the upper electrode ring is separated from the upper PEZ ring by a gap, and the gap is in fluid communication with the at least one gas passage via a tortuous path through which the process gas flows from the gas supply to the annular space.

7. The bevel etcher as recited in claim 5, wherein: (a) the lower dielectric ring includes threaded holes receiving bolts passing through holes in the lower metal liner, wherein the bolts secure the lower dielectric ring against the lower metal liner; (b) the upper dielectric ring includes threaded holes receiving bolts passing through holes in the upper metal component, wherein the bolts secure the upper dielectric ring against the upper metal component; (c) the focus ring and the upper dielectric component are formed of a ceramic optionally coated with $Y_2O_3$; and/or (d) the lower and upper dielectric rings are formed of a ceramic.

8. The bevel etcher as recited in claim 6, further comprising: (a) a hollow cathode ring surrounding the outer edges of the lower and upper dielectric rings, wherein either the hollow cathode ring is coupled to an RF power generator and the upper and lower electrode rings are grounded or the upper and lower electrode rings are coupled to an RF power generator and the hollow cathode ring is grounded during a bevel cleaning operation; or (b) an inductive coil coupled to an RF generator and surrounding the outer edges of the lower and upper dielectric rings, the upper and lower electrode rings being grounded and the coil operative to generate the plasma upon receipt of RF power from the RF generator.

9. The bevel etcher as recited in claim 2, wherein (a) the upper dielectric component has a ring-shaped flange formed along the outer edge of the bottom portion and wherein the upper PEZ ring has a mating inner flange formed along the inner edge thereof, the ring-shaped flange engaging the inner flange such that the upper PEZ ring is detachably secured to the upper dielectric component and/or (b) the lower support has a ring-shaped flange formed along the outer edge of the top portion and wherein the lower PEZ ring has a mating inner flange formed along the inner edge thereof, the ring-shaped flange engaging the inner flange such that the lower PEZ ring is detachably secured to the lower support.

10. The bevel etcher as recited in claim 1, wherein: (a) the outer diameter of the top portion of the lower PEZ ring defines the bottom edge exclusion of the substrate; (b) the lower and upper PEZ rings are formed of a material selected from the group consisting of an electrically conductive, semiconductive, dielectric material, a ceramic, and a high electrical resistance material; (c) the outer diameter of the bottom portion of the upper PEZ ring defines the top edge exclusion of the substrate; and/or (d) the cylindrical top portion of the lower support includes an electrostatic chuck.

11. A method of cleaning the bevel edge of a semiconductor substrate, comprising:

supporting a semiconductor substrate in the bevel etcher according to claim 1;

energizing process gas into a plasma; and cleaning the bevel edge with the plasma.

12. A method of replacing the upper or lower PEZ ring in the bevel etcher according to claim 5, comprising: (a) detaching the upper dielectric component from the upper metal component, disengaging a flange on the dielectric component from a flange on the upper PEZ ring, replacing the upper PEZ ring with a new PEZ ring by fitting the new PEZ ring on the dielectric plate and attaching the dielectric plate to the upper metal component or (b) lifting the lower PEZ ring above the lower support and replacing the lower PEZ ring with a new PEZ ring.

13. The plasma bevel etcher of claim 1, wherein an inner portion of the upper surface of the lower PEZ ring is configured to support the semiconductor substrate.

* * * * *